United States Patent
Kress

[11] Patent Number: 5,351,519
[45] Date of Patent: Oct. 4, 1994

[54] CIRCUIT ARRANGEMENT FOR EVALUATING AND TESTING A CAPACITIVE SENSOR

[75] Inventor: Hans-Juergen Kress, Reutlingen, Fed. Rep. of Germany

[73] Assignee: Robert Bosch GmbH, Stuttgart, Fed. Rep. of Germany

[21] Appl. No.: 958,032

[22] Filed: Oct. 7, 1992

[30] Foreign Application Priority Data

Oct. 9, 1991 [DE] Fed. Rep. of Germany ....... 4133426

[51] Int. Cl.⁵ .............................................. G01P 15/08
[52] U.S. Cl. ........................................................ 73/10
[58] Field of Search ................... 73/1 D, 2, 1 B, 4 R, 73/517 R, 862.626, 724

[56] References Cited

U.S. PATENT DOCUMENTS

| | | | |
|---|---|---|---|
| 5,148,604 | 9/1992 | Bantien | 33/366 |
| 5,153,394 | 10/1992 | Abendroth . | |
| 5,163,325 | 11/1992 | White et al. | 73/517 R |
| 5,253,510 | 10/1993 | Allen et al. | 73/1 D |

FOREIGN PATENT DOCUMENTS 3942159 6/1991 Fed. Rep. of Germany .

OTHER PUBLICATIONS

H. Leuthold & F. Rudolf, "An ASIC for High-Resolution Capacitive Microaccelerometers," in *Sensors & Actuators*, A21–A23, pp. 278–281 (Elsevier Sequoia, Netherlands, 1990).

German Patent Office action of May 22, 1992 re P 41 33 426.4.

*Primary Examiner*—Robert Raevis
*Attorney, Agent, or Firm*—Frishauf, Holtz, Goodman & Woodward

[57] ABSTRACT

A circuit for evaluating the output of, and for testing, a capacitive sensor, such as those useful for triggering airbags, features two switches (6, 7) for selecting among a test mode and a measurement mode. In the measurement mode, two measuring capacitances (3), formed by a center electrode (1) and a respective one of the two measuring electrodes, are connected to a capacitance bridge (5). In the test mode, one of the measuring capacitances is replaced by a reference capacitance (4), and the replaced measuring capacitance is connected to a voltage source (8).

5 Claims, 1 Drawing Sheet

CIRCUIT ARRANGEMENT FOR EVALUATING AND TESTING A CAPACITIVE SENSOR

Cross-reference to commonly owned patent applications, the disclosures of which are incorporated by reference:
U.S. Ser. No. 07/701,781, BANTIEN, MICROMECHANICAL TILT SWITCH, issued Sep. 22, 1992 as U.S. Pat. No. 5,148,604;
U.S. Ser. No. 07/724,142, ABENDROTH et al., TILT-ACTUATED SWITCH, issued on Oct. 6, 1992 as U.S. Pat. No. 5,153,394;
U.S. Ser. No. 07/549,009, HUSER, issued Apr. 13, 1993 as U.S. Pat. No. 5,202,589.
Cross-reference to related patent application:
German patent disclosure DE-OS 39 42 159, publ. Jun. 27, 1991.

FIELD OF THE INVENTION

The invention relates to a circuit arrangement for evaluating and testing a capacitive sensor and, more particularly, to a circuit arrangement of the kind useful for measuring acceleration, comprising a movable or deflectable center electrode positioned between two stationary electrodes, and being operable in a measuring mode and in a test mode.

BACKGROUND OF THE INVENTION

Capacitance bridge circuits for evaluating capacitive acceleration sensors are known (Leuthold H., Rudolf F., An ASIC for High-Resolution Capacitive Accelerometers, Periodical: Sensors and Actuators, 1990, Page 278–281), in which an acceleration sensor consisting of a movable center electrode and two stationary electrodes form two capacitances, whose relative capacitance with respect to each other is a measure of an acceleration. In the measuring mode, the potential of the measuring electrodes relative to the center electrode is periodically changed in a predetermined switching sequence, and the resultant charges flowing to and from the center electrode are integrated and converted into a voltage signal. With a different switching sequence, it is said to be possible to exert an electrostatic force on the center electrode at an averaged time, and thereby monitor the functioning of the sensor.

THE INVENTION

The circuit arrangement in accordance with the invention is advantageous, in that it allows self-testing of the sensors without changing the switching sequence. Therefore, the circuit arrangement in accordance with the invention allows testing of the sensors during normal operation of the capacitance bridge and can be reduced to practice in a very simple manner.

In the measuring mode of the circuit arrangement, the difference between the measuring capacitances connected to the capacitance bridge and formed by the center electrode and one of the measuring electrodes, constitutes a signal representative of the movement or deflection of the center electrode.

In the test mode, a reference capacitance connected to the capacitance bridge is substituted for one of the measuring capacitances, and a potential difference may be applied between the center electrode and the measuring electrode of the substituted measuring capacitance, and the resultant deflection of the center electrode is measurable at the other measuring capacitance.

In a further advantageous embodiment, the value of the reference capacitance substantially corresponds to the value of one of the measuring capacitances in the rest position of the center electrode.

Furthermore, in accordance with the invention, switches are provided for switching between test and measuring modes, wherein one switch switches the capacitance bridge between one of the measuring capacitances and the reference capacitance, and additional switches apply a test voltage to the substituted measuring capacitance.

In a circuit arrangement for evaluating and testing a capacitive sensor, especially for measuring acceleration, provided with a deflectable center electrode positioned between stationary electrodes, a measuring capacitance is advantageously formed by the center electrode and at least one of the stationary electrodes, a test capacitance is formed by the center electrode and at least one stationary electrode, a potential difference relative to the center electrode may be applied to the test capacitance, and the deflection of the center electrode is measurable at the measuring capacitance.

With the value of the reference capacitance corresponding to the value of the measuring capacitance in the rest position of the center electrode, the circuit will be operated in a stable operating range. Switching between test and measuring modes is accomplished in an especially simple manner by switches which switch between one of the two measuring capacitances and the reference capacitance, and which apply a test voltage to the substituted of replaced measuring capacitance. When the sensors are to be tested continuously in order to satisfy special safety requirements, for instance, the circuit arrangement may be set up in a way in which the sensor is continuously operated in the test mode.

DRAWINGS

Embodiments of the invention are depicted in the drawings and are described in more detail in the following description. In the figures:

FIG. 1 depicts the circuit arrangement in accordance with the invention for selective operation in a test mode and a measuring mode; and FIG. 2 depicts the circuit arrangement in accordance with the invention set up for continuous test mode operation.

DETAILED DESCRIPTION

Figure 1:
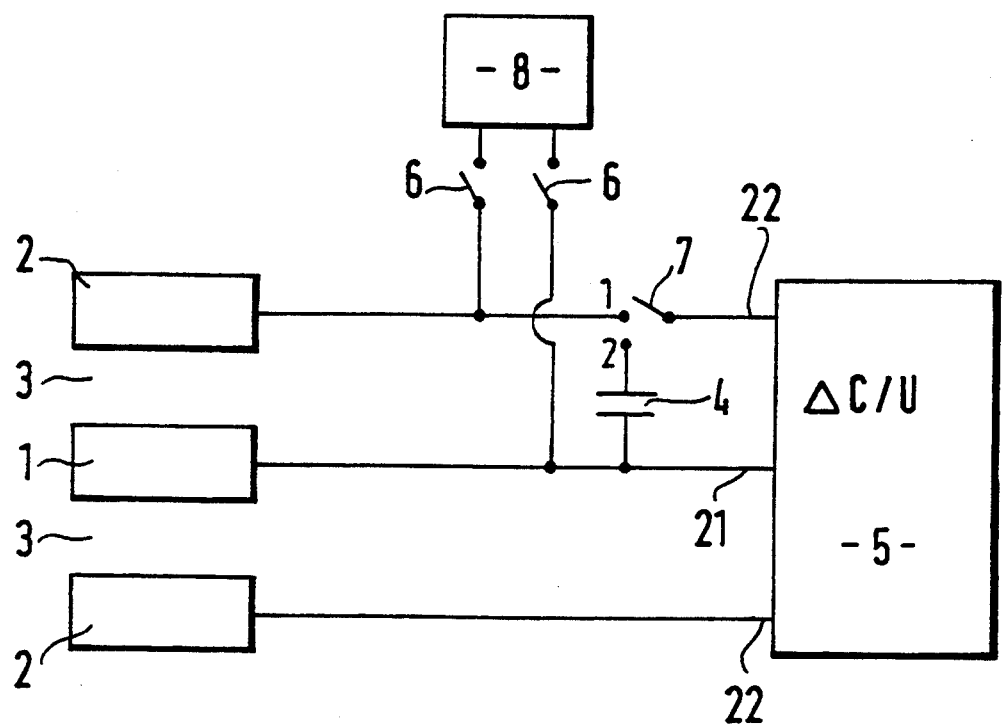

In FIG. 1, 1 designates a center electrode and 2 refers to two measuring electrodes. The center electrode 1 and either of the measuring electrodes 2 form a plate capacitor or measuring capacitance 3. The center electrode 1 is moveable relative to the measuring electrodes 2. Such an arrangement may constitute an acceleration sensor in which the center electrode consists of a seismic mass elastically suspended by springs and which in this manner is deflected from its rest position by the effect of the force of an acceleration. Since, in a plate capacitor, the capacitance is dependent upon the distance between the capacitor plates, the position of the center electrode 1 relative to the measuring electrodes 2 may be determined by measuring the two measuring capacitances 3, and the effective acceleration may thus be deduced. The circuit arrangement in accordance with the invention, is, however, not limited to an applications in acceleration sensors, but it may be equally used in any capacitive sensors having at least two capacitances.

FIG. 1 additionally depicts two switches 6, a switch 7, a reference capacitance 4, a capacitance bridge 5, and a voltage supply 8. One of the two outer input terminals 22 of the capacitance bridge 5 is connected to the switch 7. When the switch 7 is in its position 1, the two outer terminals 22 of the capacitance bridge 5 are connected to the measuring electrodes, and its center input terminal 21 is connected to the center electrode 1. When the switch 7 is in its position 2, the reference capacitance 4 is connected between the center terminal 21 and one of the outer terminals 22, and a measuring capacitance 3 is connected between the center terminal 21 and the other outer terminal 22. When the switches 6 are closed, the voltage supply 8 is connected to the center electrode 1 and that measuring electrode 2 which may be disconnected from the capacitance bridge by the switch 7.

Depending upon the position of switches 6 and 7, the circuit arrangement of FIG. 1 is either in its measuring mode or in its test mode. When the switches 6 are open and switch 7 is in its position 1, the circuit arrangement is in its measuring mode. In the measuring mode both measuring capacitances 3 are connected with the capacitance bridge 5. The position of the center electrode 1 relative to the measuring electrodes 2 determines the given value of the measuring capacitances 3. In acceleration sensors the center electrode 1 consists of a spring-mass-system, i.e., a resiliently suspended mass which is deflected from its rest position by force effect of an acceleration. The capacitance bridge 5 may, for instance, be arranged in such a manner that by comparing the two measuring capacitances 3, it generates a voltage signal proportional to the deflection of the center electrode 1. A capacitance bridge capable of performing in this manner is described, for instance, in the reference mentioned in the introductory portion of this specification.

When the switches 6 are closed and switch 7 is in its position 2, the circuit arrangement is in its test mode. In that case, the capacitance bridge 5 is connected with the reference capacitance 4 and with one of the measuring capacitances 3 only. A potential defined by the voltage supply 8 is applied opposite the center electrode 1 to the counter electrode of the measuring capacitance 3 which is not connected with the capacitance bridge 5 and which has been substituted by the reference capacitance 4. By this potential, an electrostatic force is exerted on the center electrode 1. Since the center electrode 1 is movable, this results in movement of the center electrode 1. This movement causes a change in the value of the measuring capacitance 3 connected with the capacitance bridge 5 and is detected by the capacitance bridge 5.

Figure 2:
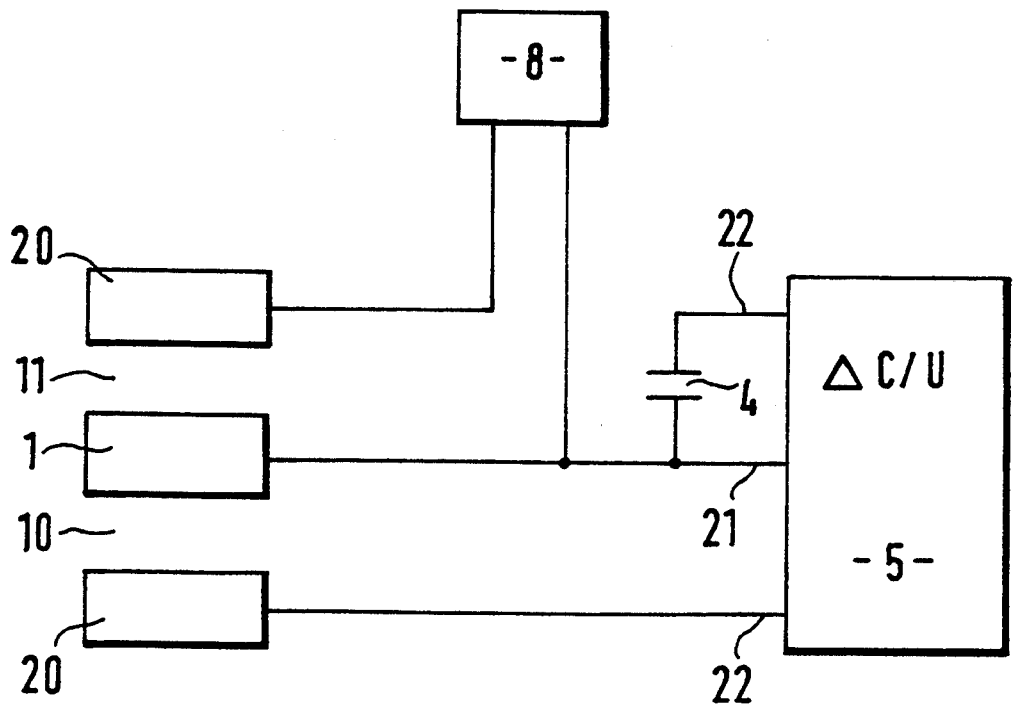

In FIG. 2, two plate capacitors, a measuring capacitance 10 and a test capacitance 11 are formed by the movable center electrode 1 and the two stationary electrodes 20. Again, this structure may be utilized as a capacitive acceleration sensor. The sensor is connected with a capacitance bridge 5, a reference capacitance 4 and a voltage supply 8, in such a manner that the embodiment of FIG. 2 corresponds to the circuit of FIG. 1 in its test mode. The capacitance bridge serves the same purpose as in FIG. 1. The center electrode 1 and the electrode 20 of the test capacitance 11 are connected with the voltage supply, so that a potential may be applied. The center terminal 21 of the capacitance bridge is connected with the reference capacitance 4 and the center electrode 1. One of the outer terminals 22 of the capacitance bridge 5 is connected with the reference capacitance 4; the other terminal 22 is connected with the electrode which is not connected to the voltage supply 8.

Movement of the center electrode 1 is detected by the measuring capacitance 10 connected with the capacitance bridge 5.

The test capacitance 11 is utilized for the electrostatic movement of the center electrode 1. A difference of potential between the center electrode 1 and the stationary electrode 20 may be applied to the test capacitance 8 by the voltage supply 8. The resultant force effect and/or movement of the center electrode 1 is demonstrated by measuring the difference between the measuring capacitance 10 and the reference capacitance 4.

The circuit arrangement shown in FIG. 2 is utilized for a continuous operation of the sensor in a test mode. This is of particular advantage, where for reasons of special safety requirements the functioning of the sensor must be monitored continuously. In such a case, continuous monitoring of the functioning of the sensor is more important than the advantages of measuring resulting from utilizing both measuring capacitances for signal evaluation. Such sensors may be useful in, for example, safety systems of automotive vehicles, such as airbag triggering systems. In such a case, the voltage supply 8 would excite the center electrode 1 with a low frequency alternating current. The presence of a corresponding signal at the output of the capacitance bridge 5 would then indicate that the sensor functions properly.

What is claimed is:

1. A circuit arrangement operable in a measuring mode of operation and in a test mode of operation, for evaluating and testing a capacitive sensor, comprising:
   first and second stationary measuring electrode means;
   third electrode means mounted for movement between a rest position and a deflected position relative to said first and second electrode means;
   capacitance bridge means;
   reference capacitance means connected to said capacitance bridge means;
   means for connecting said third electrode means to one each of said first and second electrode means thereby to form first and second measuring capacitance means;
   means for, in the measuring mode, connecting said first and second measuring capacitance means to said capacitance bridge means, whereby said capacitance bridge means detects a difference between said first and second measuring capacitance means, said difference being a signal representative of the extent of movement of said third electrode means between its said rest and deflected positions;
   means for, in the test mode, substituting said reference capacitance means for one of said first and second measuring capacitance means;
   means for applying a potential difference between said third electrode means and the electrode means of said substituted one of said first and second measuring capacitance means, thereby to cause movement of said third electrode means between its said rest and deflected positions; and
   means for measuring said movement of said third electrode means at the other of said first and second measuring capacitance means.

2. The circuit arrangement of claim 1, wherein the value of said reference capacitance means substantially corresponds to the value of one of said first and second measuring capacitance means with said third electrode means in its said rest position.

3. The circuit arrangement of claim 2, further comprising first and second swatch means for switching said circuit arrangement between its said measuring and test modes of operation, said first switch means switching said capacitance bridge means between one of said first and second measuring capacitance means and said reference capacitance means, and said second switch means applying a test voltage to said substituted one of said first and second measuring capacitance means.

4. The circuit arrangement of claim 3, wherein said first switch means is movable between a first position, connecting one of said first and second measuring electrode means with said capacitance bridge means, and a second position connecting said reference capacitance means with said capacitance bridge means.

5. The circuit arrangement of claim 4, wherein said third electrode and one of said first and second measuring electrode means form a measuring capacitance means, and wherein said third and the other of said first and second measuring electrode means form test capacitance means, said test capacitance means being connectible to a potential differing from said third electrode means to cause movement of said third electrode means, said movement being measurable at said measuring capacitance means.

* * * * *